United States Patent
Chiang et al.

(10) Patent No.: US 9,831,358 B2
(45) Date of Patent: Nov. 28, 2017

(54) PHOTOELECTRIC CONVERSION DEVICE

(71) Applicant: I-SHOU UNIVERSITY, Kaohsiung (TW)

(72) Inventors: Jung-Sheng Chiang, Kaohsiung (TW); Nai-Hsiang Sun, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 206 days.

(21) Appl. No.: 14/854,030

(22) Filed: Sep. 14, 2015

(65) Prior Publication Data

US 2016/0336462 A1    Nov. 17, 2016

(30) Foreign Application Priority Data

May 15, 2015   (TW) .............................. 104115563 A

(51) Int. Cl.
*H01L 31/00*   (2006.01)
*H01L 31/0216*   (2014.01)
*H01L 31/048*   (2014.01)
*G02B 1/00*   (2006.01)

(52) U.S. Cl.
CPC ........ *H01L 31/02168* (2013.01); *G02B 1/005* (2013.01); *H01L 31/048* (2013.01); *Y02E 10/50* (2013.01)

(58) Field of Classification Search
CPC ........... H01L 31/0216; H01L 31/02161; H01L 31/02162; H01L 31/02167; H01L 31/02168; H01L 31/0232; H01L 31/02327; H01L 31/0236; H01L 31/02366; G02B 6/1225
See application file for complete search history.

(56) References Cited

U.S. PATENT DOCUMENTS

| | | | | |
|---|---|---|---|---|
| 5,994,641 | A | * 11/1999 | Kardauskas | H01L 31/048 136/246 |
| 2007/0269918 | A1 | * 11/2007 | Cho | H01L 33/22 438/32 |
| 2011/0203663 | A1 | * 8/2011 | Prather | H01L 31/02168 136/259 |
| 2011/0247676 | A1 | 10/2011 | Grossman et al. | |
| 2012/0234392 | A1 | * 9/2012 | Asami | H01L 51/4213 136/262 |

FOREIGN PATENT DOCUMENTS

| | | |
|---|---|---|
| CN | 102696114 | 2/2015 |
| TW | 583729 | 4/2004 |
| TW | M304112 | 1/2007 |
| TW | 201011925 | 3/2010 |
| TW | 201240112 | 10/2012 |
| TW | I408825 | 9/2013 |
| TW | 201345832 | 11/2013 |

* cited by examiner

*Primary Examiner* — Eli Mekhlin
(74) *Attorney, Agent, or Firm* — JCIPRNET

(57) ABSTRACT

A photoelectric conversion device including a photoelectric converter, a transparent cover, an insulating material layer and a photonic crystal layer is provided. The photoelectric converter is adapted to receive a light. The transparent cover is disposed on a side of the photoelectric converter. The insulating material layer is disposed between the photoelectric converter and the transparent cover. The photonic crystal layer is disposed between the insulating material layer and the transparent cover, wherein the material of the photonic crystal layer is different from the material of the insulating material layer.

10 Claims, 13 Drawing Sheets

PHOTOELECTRIC CONVERSION DEVICE

CROSS REFERENCE TO RELATED APPLICATION

This application claims the priority benefit of Taiwan application serial no. 104115563, filed on May 15, 2015. The entirety of the above-mentioned patent application is hereby incorporated by reference herein and made a part of specification.

BACKGROUND OF THE INVENTION

Field of the Invention

The invention is related to an energy conversion device, and more particularly to a photoelectric conversion device.

Description of Related Art

After many years of development in solar cell technology, the power conversion efficiency, the stability, and the performance indices of the solar cells are greatly improved. Currently, the solar cells developed in laboratory can reach a fairly high photoelectric conversion efficiency, but the manufacturing process of the high photoelectric conversion efficiency solar cells is highly complex and expensive, so that it is very difficult to achieve mass production. Therefore, lower cost in production and higher photoelectric conversion efficiency are the important topics in developing solar cells. In practice, the photoelectric conversion efficiency of the solar cells depends on the external quantum efficiency (EQE) and the light absorption. In addition, the light absorption is increased when the quantity of incident light, an important factor, is increased. The light absorption are enhanced via the design to increase the quantity of incident light to the inside elements, so as to increase the photoelectric conversion efficiency of the solar cells.

SUMMARY OF THE INVENTION

The invention provides a photoelectric conversion device including a photoelectric converter, a transparent cover, an insulating material layer and a photonic crystal layer. The photoelectric converter is adapted to receive a light. The transparent cover is disposed on a side of the photoelectric converter. The insulating material layer is disposed between the photoelectric converter and the transparent cover. The photonic crystal layer is disposed between the insulating material layer and the transparent cover, wherein the material of the photonic crystal layer is different from the material of the insulating material layer.

In one embodiment of the invention, the insulating material layer is a flat plate, and the photonic crystal layer includes a plurality of first cavities perpendicularly extended from a surface of the photoelectric converter, wherein the first cavities are periodically arranged.

In one embodiment of the invention, the first cavities are cylindrical cavities or conical cavities.

In one embodiment of the invention, the photonic crystal layer includes a plurality of the first cavities extended in a direction perpendicular to a surface of the photoelectric converter. The insulating material layer includes a plurality of second cavities extended in the direction perpendicular to the surface of the photoelectric converter, wherein the first cavities are periodically arranged, and the second cavities are periodically arranged.

In one embodiment of the invention, the first cavities are cylindrical cavities or conical cavities.

In one embodiment of the invention, the second cavities are cylindrical cavities or conical cavities.

In one embodiment of the invention, the first cavities are periodically arranged, and the second cavities are periodically arranged. The central axis of the first cavity and the central axis of the second cavity are substantially coincident in a direction perpendicular to the surface of the photoelectric converter.

In one embodiment of the invention, the first cavities are periodically arranged, and the second cavities are periodically arranged. The central axis of the first cavity and the central axis of the second cavity are not substantially coincident in a direction perpendicular to the surface of the photoelectric converter.

In one embodiment of the invention, the material of the insulating material layer includes titanium dioxide or silicon dioxide.

In one embodiment of the invention, the material of the photonic crystal layer includes silicon dioxide or titanium dioxide.

Based on the above, in the photoelectric conversion device of the embodiments in the invention, the insulating material layer is disposed between the photoelectric converter and the transparent cover, the photonic crystal layer is disposed between the insulating material layer and the transparent cover, and the material of the photonic crystal layer is different from the material of the insulating material layer, so as to increase the quantity of incident light of the photoelectric converter.

In order to make the aforementioned and other features and advantages of the invention more comprehensible, embodiments accompanying figures are described in detail below.

DESCRIPTION OF THE EMBODIMENTS

Figure 1:
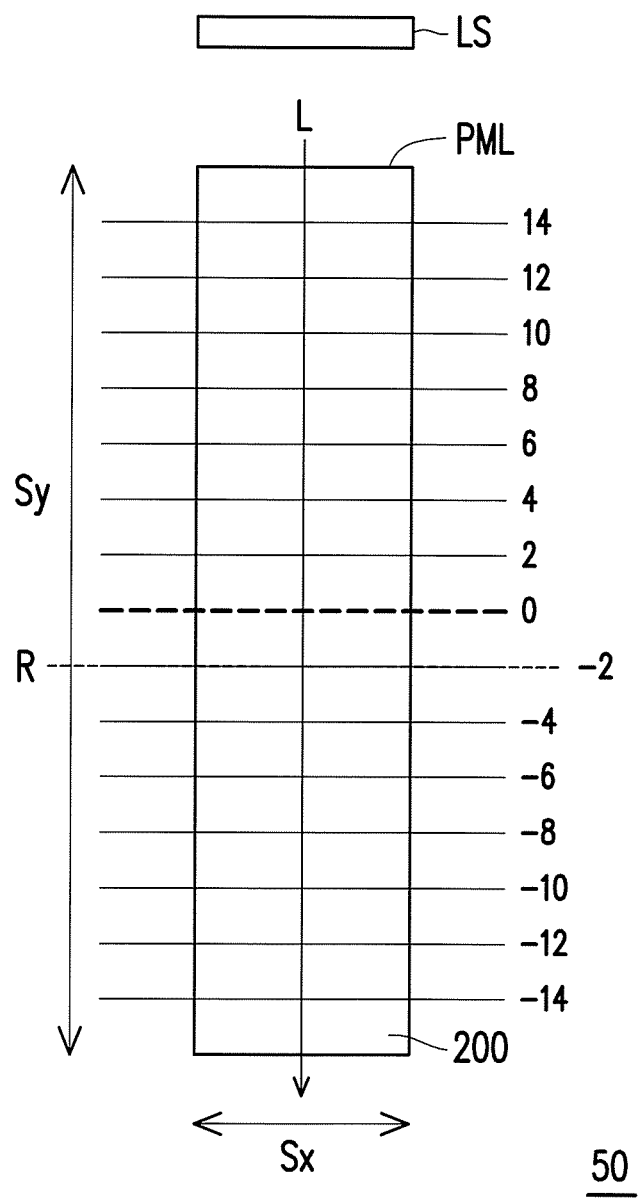
FIG. 1 is a cross-sectional view depicting a simulation of a photoelectric conversion device of one comparative embodiment and setting conditions of finite-difference time-domain method.

FIG. 1 is a cross-sectional view depicting a simulation of a photoelectric conversion device of one comparative embodiment and setting conditions of finite-difference time-domain method. Referring to FIG. 1, in the present embodiment, a photoelectric conversion device 50 includes a photoelectric converter 200 which is adapted to receive a light L. Specifically, the photoelectric converter 200 is silicon solar cells, or other forms of photoelectric device able to perform photoelectric conversion. In the present embodiment, in order to simulate the electromagnetic wave transmitting through the photoelectric conversion device 50 and to analyze the ratio of the received energies under different conditions, the finite-difference-time-domain method (FDTD method), an appropriate method to calculate the dynamic behavior of the electromagnetic wave, is used as a numerical analysis method, and cases having more complex boundary condition are also simulated. In the related embodiments of the invention, the FDTD method is used to analyze the electromagnetic wave transmitting through the photoelectric conversion device, but the invention is not limited thereto, other numerical methods appropriate to calculate the dynamic behavior of the electromagnetic wave can be used to analyze the photonic conversion device.

Referring to FIG. 1, in the present embodiment, in order to prevent unable to calculate and non-physical reflection phenomenon, the photoelectric conversion device 50 further includes a perfectly matched layer PML to fulfil the absorbent boundary conditions. The simulated electromagnetic wave is not reflected when it propagates to the perfectly matched layer PML which is an artificial boundary, so that the simulation results are the same as in the real condition.

The table 1 below shows the initial settings of computational cell to simulate the photoelectric conversion device 50 in the present embodiment. It should be noted that the invention is not limited to the data listed in Table 1. It should be known to those ordinary skilled in the art that various modifications and variations can be made to the parameters or settings of the present invention without departing from the scope or spirit of the invention.

TABLE 1

| | |
|---|---|
| The horizontal length of the computational cell (Sx) | 10 (μm) |
| The vertical length of the computational cell (Sy) | 32 (μm) |
| The relative permittivity of air | 1 |
| The thickness of the perfectly matched layer (PML) | 1 (μm) |
| The lattice constant (a) | 1 (μm) |
| The light source | The Gaussian source |
| The wavelength of the light source (λ) | 0.6 μm |
| The center frequency of the light source | 1.67 |
| The bandwidth of the light source | 0.1 |

In the present embodiment, dimension is used by the finite-difference-time-domain method to calculate. The complex parameters, such as the absolute permittivity ($\epsilon_0$), the absolute permeability ($\mu_0$), the velocity of light ($3 \times 10^8$ m/s, c) etc., can be normalized and set as 1, so as to analyze the simulation results through the ratio directly in the simulation process. Besides in the present embodiment, the Gaussian source is further adopted to serve as the light source LS in the simulation of the photoelectric conversion device 50 and emits the light L perpendicular to the photoelectric converter 200. The light source of the embodiments in the invention is a Gaussian source which emits the light L perpendicular to the photoelectric converter, but the invention is not limited thereto. Other types of simulation light source emitting the light perpendicular to the photoelectric converter can be used. Besides, in the present embodiment and related embodiments in the invention, when the Gaussian source is set up, the center frequency and the bandwidth need being considered. Specifically, the lattice constant is set to 1. In addition, the frequency (f) of the incident wave, i.e., the ratio of the lattice constant to the incident light wavelength (λ) is presented by the normalized frequency, the settings of the normalized frequency is $a/\lambda (=\omega a/2\pi c_0 = fa/c_0)$.

Referring to FIG. 1 and Table 1, in the present embodiment, the horizontal length of the computational cell (Sx) is set to 10 μm, the vertical length of the computational cell (Sy) is set to 32 μm. During the simulation, the photoelectric conversion device 50 is covered by the perfectly matched layer PML having thickness of 1 μm and located in the computational cell. Besides the position of the light receiving surface of the photoelectric converter 200 in the computational cell is the zero-point in the vertical axis coordinate. The region from one side facing the light source LS of the light receiving surface to the perfectly matched layer PML is a media having relative permittivity equal to 1, so as to simulate the air. In addition, the region from the other side of the light receiving surface to the perfectly matched layer PML is a media having relative permittivity equal to 12, so as to simulate the solar cells. Starting from the zero-point in the vertical axis coordinate, the fixed positions having 2 μm interval are arranged long the direction R perpendicular to the light receiving surface of the photoelectric converter 200, such as ±2, ±4, ±6, ±8, ±10, ±12, and ±14. The light L is emitted from the light source LS, and by the field pattern of the light L when transferring is calculated and simulated by the finite-difference-time domain method, the quantity of energy flux is calculated at different fixed positions respectively, so as to identify the degree of energy loss of the light L when passing though different fixed positions of the photoelectric conversion device 50 and to identify the degree of variation of the energy flux. The unit of the energy flux is Watts per square meter (W/m$^2$), so that the energy value, its unit is Watt (W), can be obtained by surface integral of unit size of the computational cell.

In the present embodiment, when the photoelectric conversion device 50 is simulated by the finite-difference-time domain method under the above-mentioned conditions, a surface receiving light L is located in the photoelectric converter 200 at the −2 μm position along the vertical direction (the position inside the photoelectric converter 200) to serve as a light receiving area R, so as to calculate the energy flux of the light L passing through the photoelectric converter to be a reference value, and to prevent unnecessary effect and interference. In the present embodiment, to be more specific, the calculated energy flux at receiving area R of the photoelectric conversion device 50 is 29.99502167 Watts per square meter (W/m$^2$). If the original simulating the photoelectric conversion device 50 is changed to simulating the air, namely, the perfectly matched layer PML only contains the media having the media having relative permittivity equal to 1 in the simulation environment, the calculated energy flux at a position the same as the receiving area R is 40.68963037 Watts per square meter. The energy transmission rate can be calculated by dividing the calculated energy flux at at receiving area R of the photoelectric conversion device 50 by the calculated energy flux at receiving area R of the air. Namely, 29.99502167 Watts per square meter is divided by 45.65358650 Watts per square meter and multiplied by 100%, so as to obtain that the energy transmission rate is equal to 65.7%. It should be noted that, the value of the energy flux and the energy transmission rate is calculated as an example under the above-mentioned setting conditions and should not be used to limit the scope of the invention.

Figure 2:
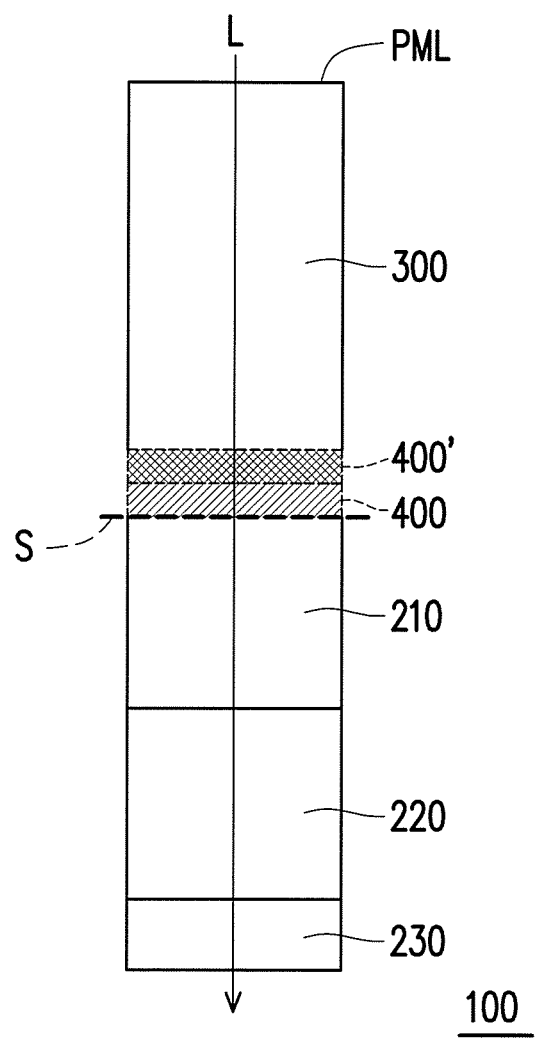
FIG. 2 is a cross-sectional view depicting a simulation of a photoelectric conversion device of another comparative embodiment.

FIG. 2 is a cross-sectional view depicting a simulation of a photoelectric conversion device of another embodiment of the invention. Referring to FIG. 2, in the present embodiment, the photoelectric conversion device 100 includes the photoelectric converter 200, a transparent cover 300, an insulating material layer 400. Besides, the photoelectric conversion device 100 also includes an insulating material layer 400'. The photoelectric converter 200 is the same as the photoelectric converter 200 of the photoelectric conversion device 500 of the comparative embodiment. The transparent cover 300 is disposed on a side of the photoelectric converter 200. The insulating material layer 400 is disposed between the photoelectric converter 200 and the transparent cover 300. The insulating material layer 400' is configured between the transparent cover 300 and the insulating material layer 400 which are passed through by the light L. In the present comparative embodiment, specifically, the detailed structure of the photoelectric converter 200 further includes an N type semiconductor layer 210, a P type semiconductor layer 220, and an electrode layer 230. The P type semiconductor layer 220 is located between the N type semiconductor layer 210 and the electrode layer 230, and the N type semiconductor layer 210 is located between the insulating material layer 400 and the P type semiconductor layer 220. In some embodiments, the position of the N type semiconductor layer 210 and the position of the P type semiconductor layer can be interchanged; that is, the N type semiconductor layer 210 is located between the P type semiconductor layer 220 and the electrode layer 230, and the P type semiconductor layer 220 is located between the insulating material layer 400 and the N type semiconductor layer 210. In addition, in some embodiments, a patterning electrode (not shown) is in between the photoelectric converter 200 and the insulating material layer 400. The insulating material layer 400 can be located between the insulating material layer 400' and an area without electrode of the patterning electrode, and the insulating material layer 400 also can be located between the insulating material layer 400' and the whole patterning electrode. In the related embodiments of the invention, the photoelectric converter can include the above-mentioned detailed structure, but the invention is not limited thereto. The photoelectric converter in the relative embodiments further includes, for example, an antireflection layer or a structure adapted to apply to the photoelectric converter.

In the present compared embodiments, the material of the insulating material layer 400' is different from the material of the insulating material layer 400. Specifically, the material of the insulating material layer 400 includes titanium dioxide (TiO$_2$), or silicon dioxide (SiO$_2$ or silica), and the material of the insulating material layer 400' includes silicon dioxide, or titanium dioxide. Generally, when the light L enters the solar cells having different material flat plates which are superimposed to obtain an effect that the index of refraction is gradually changed, the reflected light part is reduced and a large quantity of light energy enters solar cells. Therefore, the insulating material layer 400, the insulating material layer 400', and photoelectric converter 200 in the invention are superimposed and made by different materials, so that the index of refraction is gradually changed from the insulating material layer 400 through the insulating material layer 400' to photoelectric converter 200. When the light entering the titanium dioxide has wavelength equal to 6 μm, the index of refraction of the titanium dioxide is greater than the index of refraction of the silicon dioxide, so that the insulating material layer 400 is the titanium dioxide flat plate, which is located on the surface S of the photoelectric converter 200 receiving the light L, and the insulating material layer 400' is the silicon dioxide flat plate. In the present embodiment, the photoelectric converter 200 is solar cell which is simulated by the finite-difference-time-domain method with the relative permittivity is set to 12, the same as in the simulation of the photoelectric converter 50 in FIG. 1. The transparent cover 300 serves as a light receiving surface of a protection layer of the photoelectric converter 200, the material of the transparent cover 300 includes glass or other materials having a high light transmission property. In the present embodiment, transparent cover 300 is simulated by the finite-difference-time domain method with the relative permittivity is set to 1, the same as in the simulation of the air. Hence, the photoelectric conversion device 500 and 100 can be simulated with and without the insulating material layer 400 and the insulating material layer 400' for comparison purposes.

In the present comparative embodiment, the photoelectric conversion device 100 is placed in a simulation environment which is the same as the simulation environment of the photoelectric conversion device 50. The simulation of the photoelectric conversion device 100 also includes simulating the perfectly matched layer PML which is used to fulfil the absorbent boundary conditions, and a surface receiving light L is located at the photoelectric converter 200 at the −2 μm position along the vertical direction (the position inside the photoelectric converter 200) to serve as a light receiving area R. The detail settings for the computational cell to simulate the energy flux of the photoelectric conversion device 100 by the finite-difference-time-domain method are referenced to the FIG. 1 and Table 1, and will not be repeated.

Figure 3:
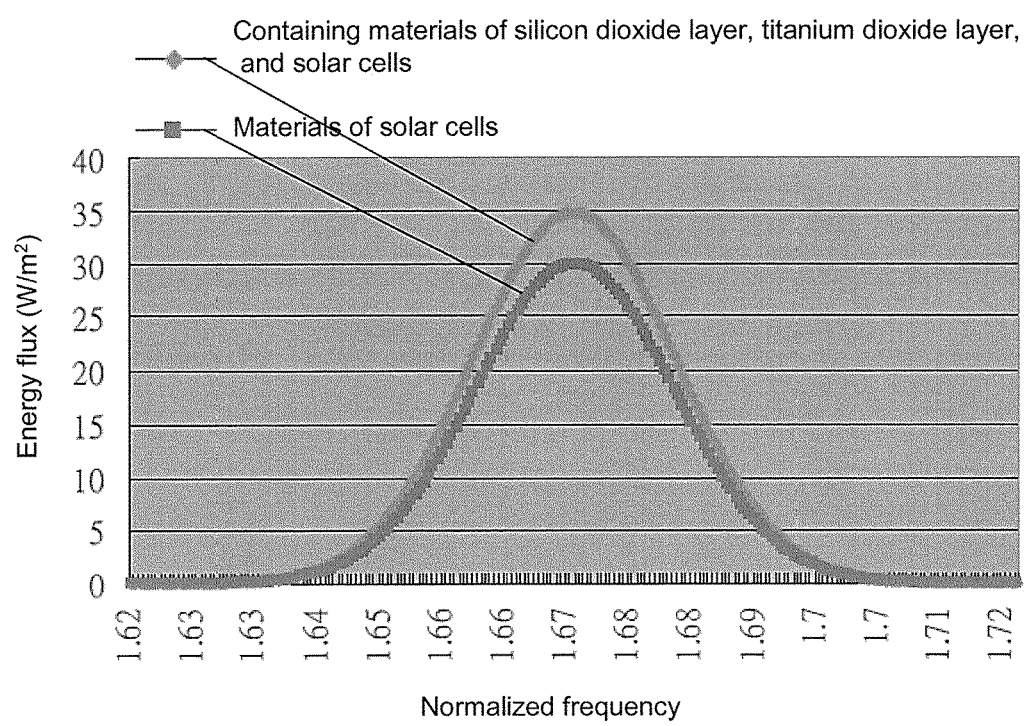
FIG. 3 is a graph depicting the simulation results of energy flux and normalized frequency of the photoelectric conversion device 100 in FIG. 2 and the photoelectric conversion device 50 in FIG. 1.

FIG. 3 is a graph depicting the simulation results of energy flux and normalized frequency of photoelectric conversion device 100 in FIG. 2 and photoelectric conversion device 50 in FIG. 1. Referring to FIG. 3, in the present comparative embodiment, based on the results calculated by the finite-difference-time-domain method, the calculated energy flux at receiving area R of the photoelectric conversion device 100, which has the titanium dioxide flat plate serving as the insulating material layer 400 and has the silicon dioxide flat plate serving as the insulating material layer 400', is equal to 34.83107839 Watts per square meter. Considering the photoelectric conversion device 500 which does not include the insulating material layer 400 and the insulating material layer 400' of the embodiment in FIG. 1, the energy transmission rate can be calculated by dividing the calculated energy flux at receiving area R of the photoelectric conversion device 100 by the calculated energy flux at receiving area R of the photoelectric conversion device 50. Namely, 34.83107839 Watts per square meter is divided by 29.99502167 Watts per square meter and multiplied by 100%, so as to obtain that the energy transmission rate is equal to 116.12%. On the contrary, the perfectly matched layer PML only contains the media having the media having relative permittivity equal to 1 in the simulation environment, the energy transmission rate can be calculated by dividing the calculated energy flux at receiving area R of the photoelectric conversion device 100 by the calculated energy flux at receiving area R of the air. Namely, 34.83107839 Watts per square meter is divided by 45.65358650 Watts per square meter and multiplied by 100%, so as to obtain that the energy transmission rate is equal to 76.3%. It is described in FIG. 3 that, the energy flux at the receiving area R of the photoelectric conversion device 100 is greater than the energy flux at the receiving area R of the photoelectric conversion device 50. In the present comparative embodiment, the photoelectric conversion device 100 including the titanium dioxide flat plate and the silicon dioxide flat plate has a larger quantity of incident light than the photoelectric conversion device 50 having none of the flat plate.

Figure 4A:
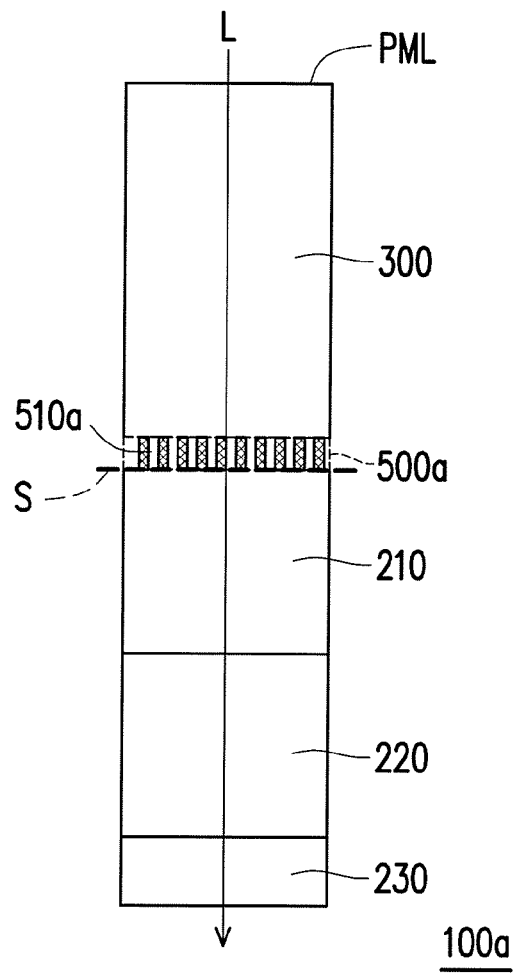
FIG. 4A is a cross-sectional view depicting a simulation of a photoelectric conversion device of one embodiment in the invention.

FIG. 4A is a cross-sectional view depicting a simulation of a photoelectric conversion device of one embodiment in the invention. Referring to FIG. 4A, in the present embodiment, the photoelectric conversion device 100a is similar to the photoelectric conversion device 100, the main elements of the photoelectric conversion device 100a can be referenced from the photoelectric conversion device 100 and will not be repeated. The difference is that, the photonic conversion device 100a does not include the insulating material layer 400 and the insulating material layer 400', and the photoelectric conversion device 100a further includes a photonic crystal layer 500a, the photonic crystal layer 500a includes a plurality of first cavities 510a extended in a direction perpendicular to a surface S of the photoelectric converter 200, wherein the first cavities 510a are periodically arranged. The first cavities 510a are, for example, cylindrical cavities, or conical cavities, or cavities having other shapes.

Figure 4B:
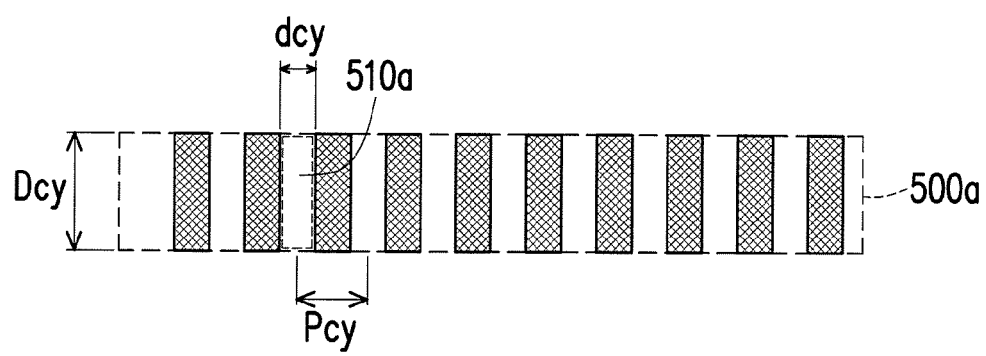
FIG. 4B is an enlarged cross-sectional view depicting a photonic crystal layer 500a in simulation in FIG. 4A.

FIG. 4B is an enlarged cross-sectional view depicting a photonic crystal layer 500a in simulation in FIG. 4A. Referring to FIG. 4B and FIG. 4A, specifically, in the present embodiment, the first cavities 510a are cylindrical cavities, and the ratio of the diameter dcy to the depth Dcy of the cylindrical cavities is from 0.5 to 0.9. Besides, the pitch Pcy of two adjacent first cavities 510a is from 1 to 1.2 micrometer (μm). In the present embodiment, the material of the photonic crystal layer 500a having the first cavities 510a with periodic property is silicon dioxide.

FIG. 4 is a cross-sectional view depicting a simulation of a photoelectric conversion device of another embodiment in the invention. Referring to FIG. 4C, in the present embodiment, the photoelectric conversion device 100b is similar to the photoelectric conversion device 100a, the main elements of the photoelectric conversion device 100b can be referenced from the photoelectric conversion device 100a and will not be repeated. The different is that, the photoelectric conversion device 100b includes the insulating material layer 400. In the present embodiment, the insulating material layer 400 is disposed between the photonic crystal layer 500a and the photoelectric converter 200, and the insulating material layer 400 includes a titanium dioxide flat plate.

Figure 4C:
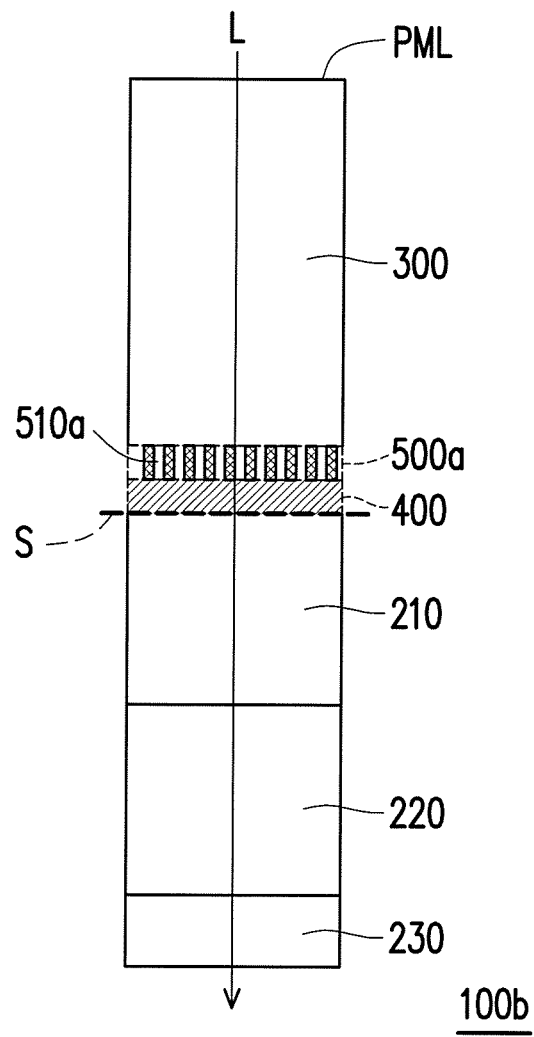
FIG. 4C is a cross-sectional view depicting a simulation of a photoelectric conversion device of another embodiment in the invention.
Figure 4D:
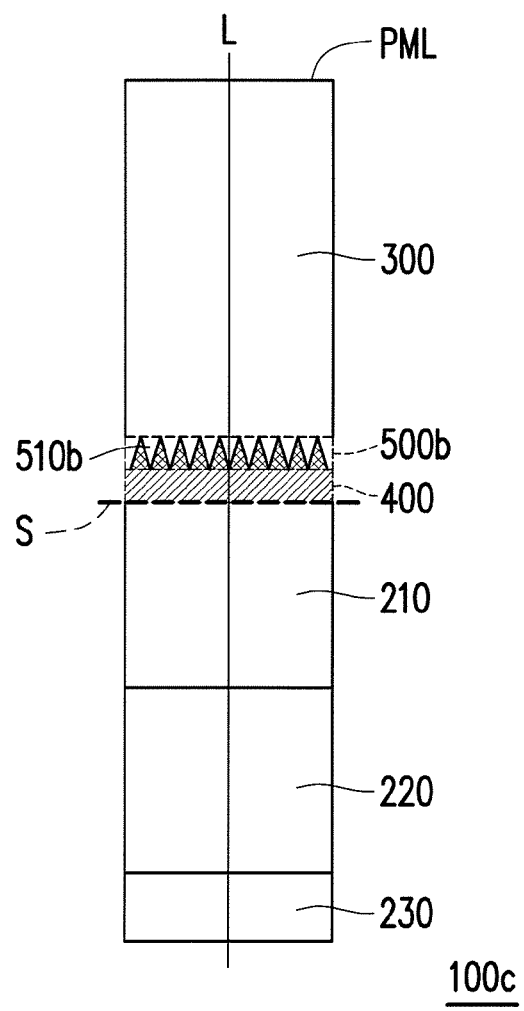
FIG. 4D is a cross-sectional view depicting a simulation of a photoelectric conversion device of another embodiment in the invention.

FIG. 4D is a cross-sectional view depicting a simulation of a photoelectric conversion device of another embodiment in the invention. Referring to FIG. 4D, in the present embodiment, the photoelectric conversion device 100c is similar to the photoelectric conversion device 100b, the main elements of the photoelectric conversion device 100c can be referenced from the photoelectric conversion device 100b and will not be repeated. The difference is that, the photonic crystal layer 500b of the photoelectric conversion device 100c includes a plurality of first cavities 510b extended in the direction perpendicular to the surface S of the photoelectric converter 200, wherein the first cavities 510b are periodically arranged. The first cavities 510b are, for example, cylindrical cavities, or conical cavities, or cavities having other shapes.

Figure 4E:
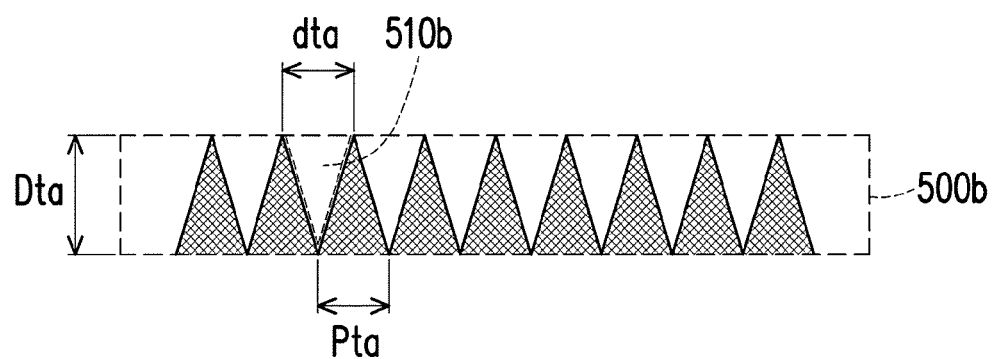
FIG. 4E is an enlarged cross-sectional view depicting a photonic crystal layer 500b in the simulation in FIG. 4D.

FIG. 4E is an enlarged cross-sectional view depicting a photonic crystal layer 500b in the simulation in FIG. 4D. Referring to FIG. 4D and FIG. 4E, specifically, in the present embodiment, the first cavities 510b can be conical cavities, and the ratio of the diameter dta of the conical cavities to the depth of the conical cavities is from 0.5 to 0.9. Besides, the pitch Pta of two adjacent first cavities 510b is from 1 to 1.2 μm. In the present embodiment, the material of the photonic crystal layer 500b having the first cavities 510b with periodic property is silicon dioxide, and the insulating material layer 400 includes a titanium dioxide flat plate.

Figure 4F:
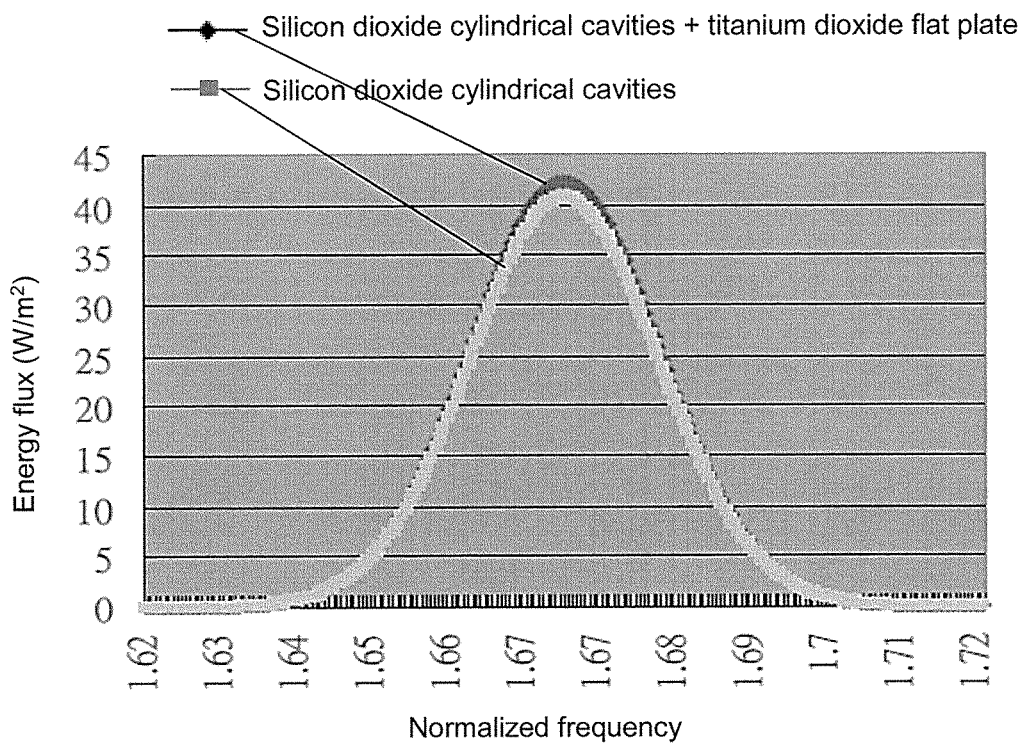
FIG. 4F is a graph depicting the simulation results of energy flux and normalized frequency of the photoelectric conversion device 100a in FIG. 4A and the photoelectric conversion device 100b in FIG. 4C.

FIG. 4F is a graph depicting the simulation results of energy flux and normalized frequency of the photoelectric conversion device 100a in FIG. 4A and the photoelectric conversion device 100b in FIG. 4C. Referring to FIG. 4F, in the present embodiment, the photoelectric conversion device 100a and the photoelectric conversion device 100b are placed in a simulation environment which is the same as the simulation environment of the photoelectric conversion device 50 in FIG. 1. The simulation of the photoelectric conversion device 100a and the photoelectric conversion device 100b also includes simulating the perfectly matched layer PML which is used to fulfil the absorbent boundary conditions, and the surface receiving light L is located at the photoelectric converter 200 at the −2 μm position along the vertical direction (the position inside the photoelectric converter 200) to serve as the light receiving area R. The detail settings for the computational cell to simulate the energy flux of the photoelectric conversion device 100a and the photoelectric conversion device 100b by the finite-difference-time-domain method are referenced to the FIG. 1 and Table 1, and will not be repeated.

In the present embodiment, the photoelectric conversion device 100a includes the photonic crystal layer 500a formed by cylindrical cavities having periodic property. After the simulation by the finite-difference-time-domain method, the calculated energy flux at receiving area R of the photoelectric conversion device 100a is equal to 40.68963037 Watts per square meter. Besides, in one embodiment of the invention, the insulating material layer 400 of the photoelectric conversion device 100b is a titanium dioxide flat plate, and the photonic crystal layer 500b of the photoelectric conversion device 100b is conical cavities having periodic property. After the simulation by the finite-difference-time-domain method, the calculated energy flux at receiving area R of the photoelectric conversion device 100b is equal to 42.28312740 Watts per square meter. The energy transmission rate relatively between the photoelectric conversion device 100b and the photoelectric conversion device 100a can be calculated by dividing the calculated energy flux at receiving area R of the photoelectric conversion device 100b by the calculated energy flux at receiving area R of the photoelectric conversion device 100a. Namely, 42.28312740 Watts per square meter is divided by 40.68963037 Watts per square meter and multiplied by 100%, so as to obtain that the energy transmission rate is equal to 103.92%. In the present embodiment, the energy transmission rate between the photoelectric conversion device 100b, which has the cylindrical cavities having periodic property to serve as the photonic crystal layer 500a, and the media (the air) having the media having relative permittivity equal to 1, which is only contained by the perfectly matched layer PML, can be calculated by dividing the calculated energy flux at receiving area R of the photoelectric conversion device 100b by the calculated energy flux at receiving area R of the air, so as to obtain that the energy transmission rate is equal to 92.6%. In FIG. 4F, the silicon dioxide cylindrical cavities present the cylindrical cavities having periodic property which serve as the photonic crystal layer 500a of the photoelectric conversion device 100a, and the photoelectric conversion device does not include the insulating material layer 400. Moreover, the silicon dioxide cylindrical cavities and the titanium dioxide flat plate present the photoelectric conversion device 100b of one embodiment in the invention. In the photoelectric conversion device 100b, the cylindrical cavities having periodic property serve as the photonic crystal layer 500a, and the titanium dioxide flat plate serve as the insulating material layer 400. It is described in FIG. 4F that, the energy flux at the receiving area R of the photoelectric conversion device 100b is greater than the energy flux at the receiving area R of the photoelectric conversion device 100a. In the present embodiment, the photoelectric conversion device 100b, which has the photonic crystal layer 500a made by the cylindrical cavities having periodic property and has the insulating material layer 400 made by the titanium dioxide flat plate, has a larger quantity of incident light than the photoelectric conversion device 100a, which does not include the insulating material layer 400 made by the titanium dioxide flat plate. Moreover, compared to the embodiment in FIG. 2 and FIG. 3 wherein the energy transmission rate relatively between the photoelectric conversion device 100 and the air is equal to 76.3%, the energy transmission rate relatively between the photoelectric conversion device 100b and the air is equal to 92.6%, so that the photoelectric conversion device 100b has a larger quantity of incident light.

Figure 4G:
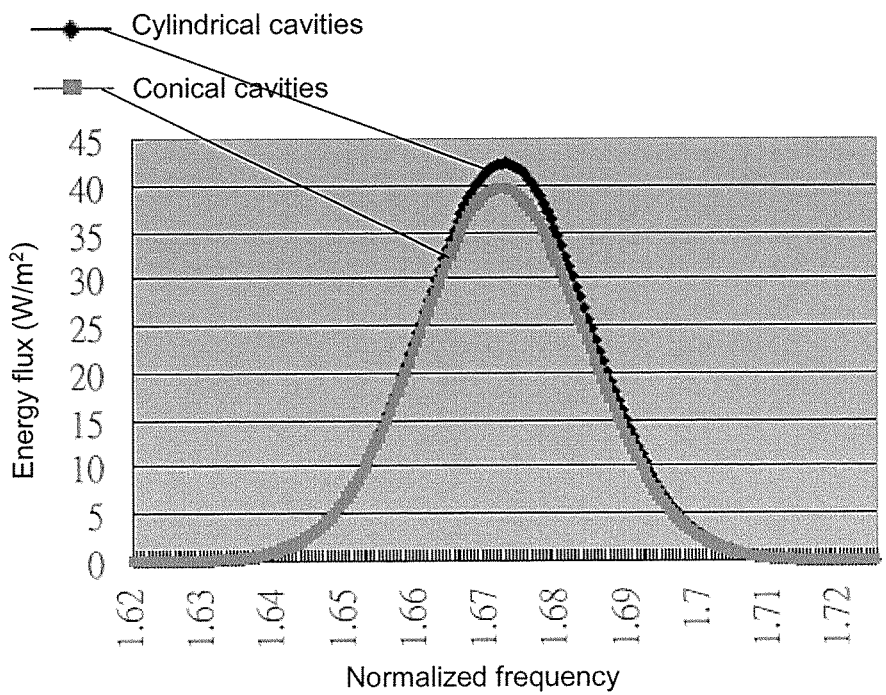
FIG. 4G is a graph depicting the simulation results of energy flux and normalized frequency of the photoelectric conversion device 100b in FIG. 4C and the photoelectric conversion device 100c in FIG. 4D.

FIG. 4G is a graph depicting the simulation results of energy flux and normalized frequency of the photoelectric conversion device 100b in FIG. 4C and the photoelectric conversion device 100c in FIG. 4D. Referring to FIG. 4G, in the present embodiment, the photoelectric conversion device 100b and the photoelectric conversion device 100c are placed in a simulation environment which is the same as the simulation environment of the photoelectric conversion device 50 in FIG. 1. The simulation of the photoelectric conversion device 100b and the photoelectric conversion device 100c also includes simulating the perfectly matched layer PML which is used to fulfil the absorbent boundary conditions, and a surface receiving light L is located at the photoelectric converter 200 at the −2 μm position along the vertical direction (the position inside the photoelectric converter 200) to serve as a light receiving area R. The detail settings for the computational cell to simulate the energy flux of the photoelectric conversion device 100b and the photoelectric conversion device 100c by the finite-difference-time-domain method are referenced to the FIG. 1 and Table 1, and will not be repeated.

In the present embodiment, the results calculated by the finite-difference-time-domain method of the photoelectric conversion device 100b is the same as the results shown in FIG. 4F, the calculated energy flux at receiving area R of the photoelectric conversion device 100b is equal to 42.28312740 Watts per square meter. Besides, the insulating material layer 400 of the photoelectric conversion device 100c is a titanium dioxide flat plate, but the photonic crystal layer 500b of the photoelectric conversion device 100c is conical cavities having periodic property. After the simulation by the finite-difference-time-domain method, the calculated energy flux at receiving area R of the photoelectric conversion device 100c is equal to 39.59895216 Watts per square meter. The energy transmission rate relatively between the photoelectric conversion device 100b and the photoelectric conversion device 100c can be calculated by dividing the calculated energy flux at receiving area R of the photoelectric conversion device 100b by the calculated energy flux at receiving area R of the photoelectric conversion device 100c. Namely, 42.28312740 Watts per square meter is divided by 39.59895216 Watts per square meter and multiplied by 100%, so as to obtain that the energy transmission rate is equal to 106.78%. In FIG. 4G, the cylindrical cavities present the cylindrical cavities having periodic property which serve as the photonic crystal layer 500a of the photoelectric conversion device 100b. Moreover, the conical cavities present the conical cavities having periodic property which serve as the photonic crystal layer 500b of the photoelectric conversion device 100c. It is described in FIG. 4G that, the energy flux at the receiving area R of the photoelectric conversion device 100b is greater than the energy flux at the receiving area R of the photoelectric conversion device 100c. In the present embodiment, the photoelectric conversion device 100b, which has the photonic crystal layer 500a made by the cylindrical cavities having periodic property, has a larger quantity of incident light than the photoelectric conversion device 100c, which has the photonic crystal layer 500b made by the conical cavities having periodic property.

Figure 5A:
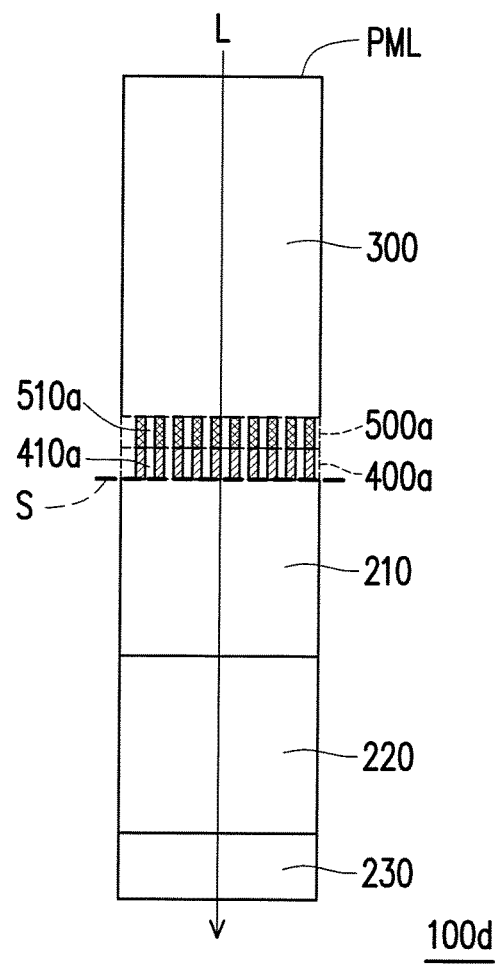
FIG. 5A is a cross-sectional view depicting a simulation of a photoelectric conversion device of another embodiment in the invention.
Figure 5B:
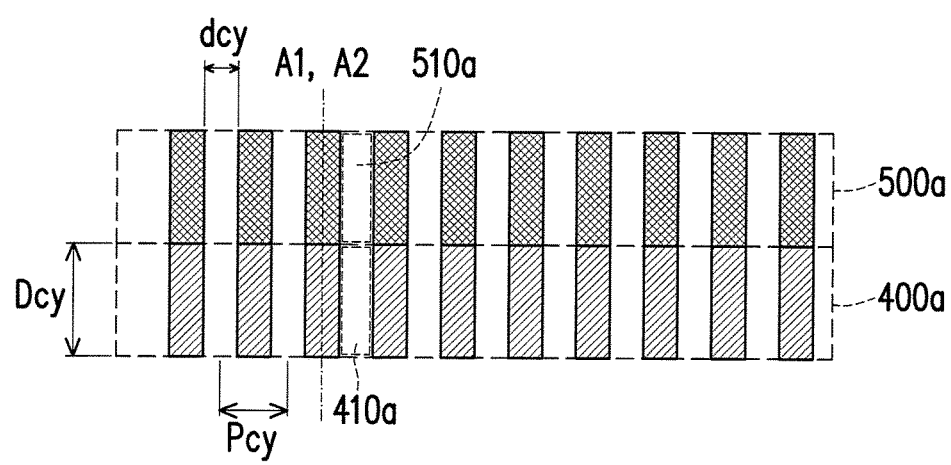
FIG. 5B is an enlarged cross-sectional view depicting insulating material layer 400a and the photonic crystal layer 500a in the simulation in FIG. 5A.

FIG. 5A is a cross-sectional view depicting a simulation of a photoelectric conversion device of another embodiment in the invention. FIG. 5B is an enlarged cross-sectional view depicting an insulating material layer 400a of the photonic crystal layer 500a in FIG. 5A. Referring to FIG. 5A and FIG. 5B, in the present embodiment, the photoelectric conversion device 100d is similar to the photoelectric conversion device 100b and the photonic crystal layer 500a of the photoelectric conversion device 100d includes a plurality of first cavities 510a extended in the direction perpendicular to the surface S of the photoelectric converter 200, the first cavities 510a are periodically arranged, and the first cavities 510a are, for example, cylindrical cavities, or conical cavities, or cavities having other shapes. The main elements of the photoelectric conversion device 100d can be referenced from the photoelectric conversion device 100b and will not be repeated. The difference is that, the insulating material layer 400a of the photonic conversion device 100d includes a plurality of second cavities 410a extended in the direction perpendicular to the surface S of the photoelectric converter 200, the second cavities 410a are periodically arranged, and the second cavities 410a are, for example, cylindrical cavities, or conical cavities, or cavities having other shapes.

Specifically, in the present embodiment, the first cavities 510a of the photoelectric conversion device 100d can be cylindrical cavities, and the ratio of the diameter dcy to the depth Dcy and the pitch Pcy of two adjacent first cavities 510a can be referenced to the photoelectric conversion device 100b in FIG. 4B and FIG. 4C. The second cavities 410a of the photoelectric conversion device 100d can be the cylindrical cavities, and the ratio of the diameter dcy to the depth Dcy of the cylindrical cavities 410a is from 0.5 to 0.9. The pitch Pcy of two adjacent second cavities 410a is from 1 to 1.2 μm. In the present embodiment, the material of the photonic crystal layer 500a having the first cavities 510b with periodic property is silicon dioxide, and the material of the insulating material layer 400a having the second cavities 410a with periodic property is titanium dioxide. Specifically, the central axis A1 of the first cavity 510a and the central axis A2 of the second cavity 410a are substantially coincident in a direction perpendicular to the surface S of the photoelectric converter 200, and the first cavity 510a and the second cavity 410a are aligned.

Figure 5C:
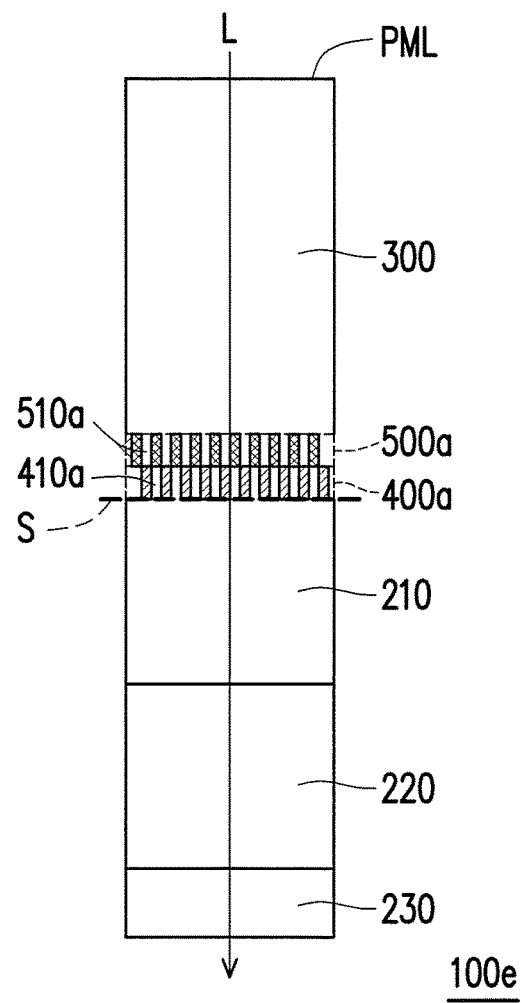
FIG. 5C is a cross-sectional view depicting a simulation of a photoelectric conversion device of another embodiment in the invention.
Figure 5D:
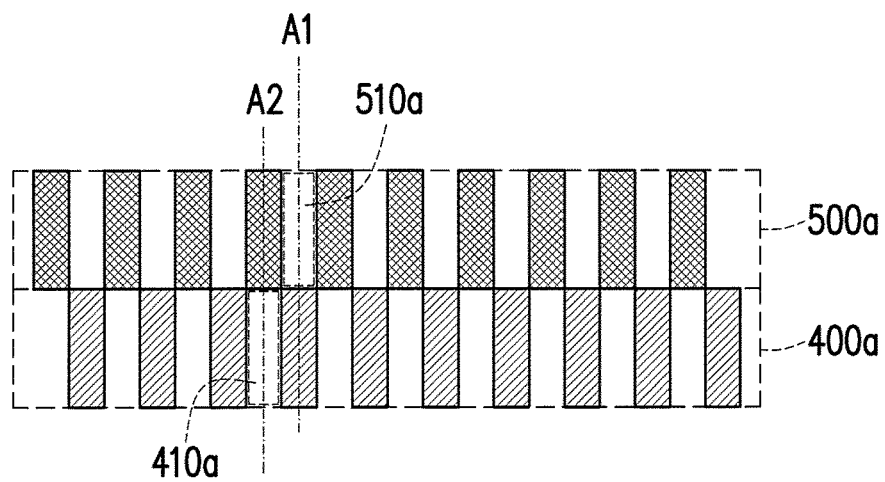
FIG. 5D is a cross-sectional view depicting the enlarged insulating material layer 400a and the photonic crystal layer 500a in FIG. 5C.

FIG. 5C is a cross-sectional view depicting a simulation of a photoelectric conversion device of another embodiment in the invention. FIG. 5D is an enlarged cross-sectional view depicting an insulating material layer 400a of the photonic crystal layer 500a in the simulation in FIG. 5C. Referring to FIG. 5C and FIG. 5D, in the present embodiment, the photoelectric conversion device 100e is similar to the photoelectric conversion device 100d, the main elements of the photoelectric conversion device 100e can be referenced from the photoelectric conversion device 100d and will not be repeated. The difference is that, the central axis A1 of the first cavity 510a and the central axis A2 of the second cavity 410a of the photoelectric conversion device 100e are not substantially coincident in a direction perpendicular to the surface S of the photoelectric converter 200, and the first cavity 510a and the second cavity 410a are not aligned.

Figure 5E:
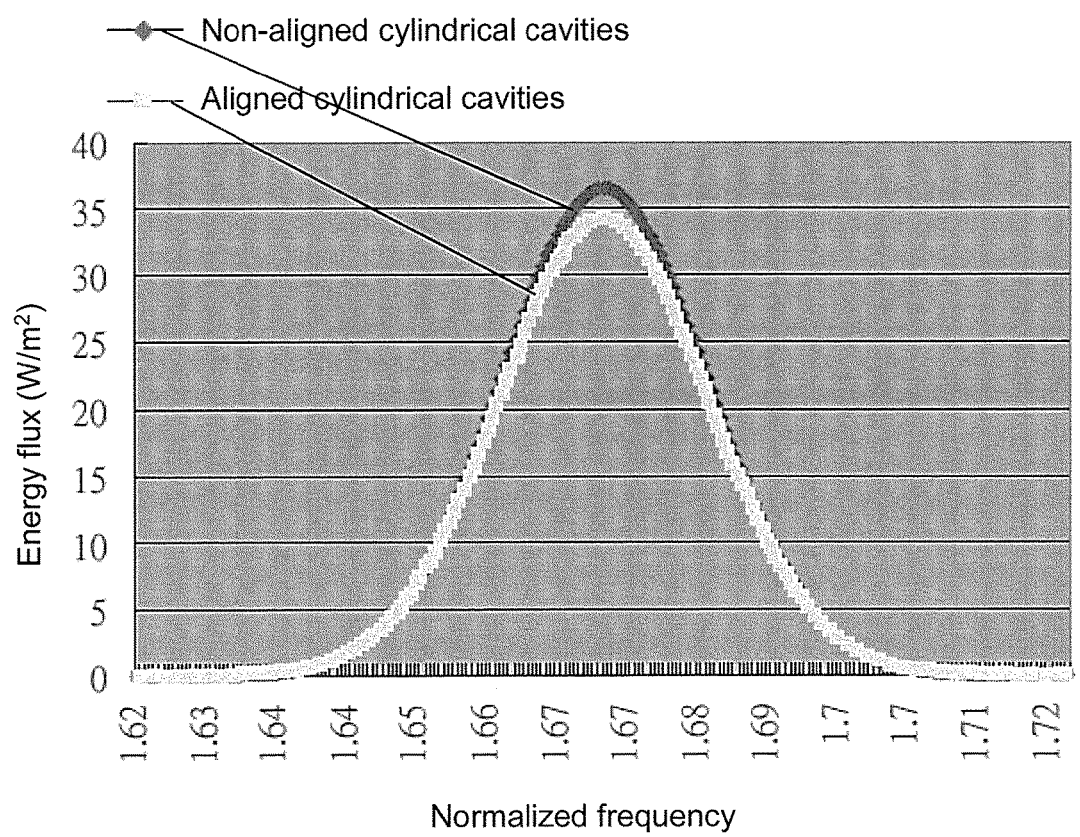
FIG. 5E is a graph depicting the simulation results of energy flux and normalized frequency of the photoelectric conversion device 100d in FIG. 5A and the photoelectric conversion device 100e in FIG. 5C.

FIG. 5E is a graph depicting the simulation results of energy flux and normalized frequency of the photoelectric conversion device 100d in FIG. 5A and the photoelectric conversion device 100e in FIG. 5C. Referring to FIG. 5E, in the present embodiment, the photoelectric conversion device 100d and the photoelectric conversion device 100e are placed in the simulation environment which is the same as the simulation environment of the photoelectric conversion device 50 in FIG. 1. The simulation of the photoelectric conversion device 100d and the photoelectric conversion device 100e also includes simulating the perfectly matched layer PML which is used to fulfil the with absorbent boundary conditions, and a surface receiving light L is located at the photoelectric converter 200 at the −2 μm position along the vertical direction (the position inside the photoelectric converter 200) to serve as a light receiving area R. The detail settings for the computational cell to simulate the energy flux of the photoelectric conversion device 100d and the photoelectric conversion device 100e by the finite-difference-time domain method are referenced to the FIG. 1 and Table 1, and will not be repeated.

In the present embodiment, after the simulation by the finite-difference-time domain method, the calculated energy flux at receiving area R of the photoelectric conversion device 100d, which has the aligned first cavities 510a and second cavities 410a, is equal to 34.28953767 Watts per square meter. The calculated energy flux at receiving area R of the photoelectric conversion device 100e, which has the non-aligned first cavities 510a and second cavities 410a, is equal to 36.50725878 Watts per square meter. The energy transmission rate relatively between the photoelectric conversion device 100e and the photoelectric conversion device 100d can be calculated by dividing the calculated energy flux at receiving area R of the photoelectric conversion device 100e by the calculated energy flux at receiving area R of the photoelectric conversion device 100d. Namely, 36.50725878 Watts per square meter is divided by 34.28953767 Watts per square meter and multiplied by 100%, so as to obtain that the energy transmission rate is equal to 106.47%. In FIG. 5E, the non-aligned cylindrical cavities present the photoelectric conversion device 100e which has the first cavities 510a and the second cavities 410a, and the first cavities 510a and the second cavities 410a are not aligned. Moreover, the aligned cylindrical cavities present the photoelectric conversion device 100d which has the first cavities 510a and the second cavities 410a, and the first cavities 510a and the second cavities 410a are aligned. It is described in FIG. 5E that, the energy flux at the receiving area R of the photoelectric conversion device 100e is greater than the energy flux at the receiving area R of the photoelectric conversion device 100d. In the present embodiment, the photoelectric conversion device 100e having the non-aligned first cavities 510a and second cavities 410a has a larger quantity of incident light than the photoelectric conversion device 100d having the aligned first cavities 510a and second cavities 410a.

Figure 6A:
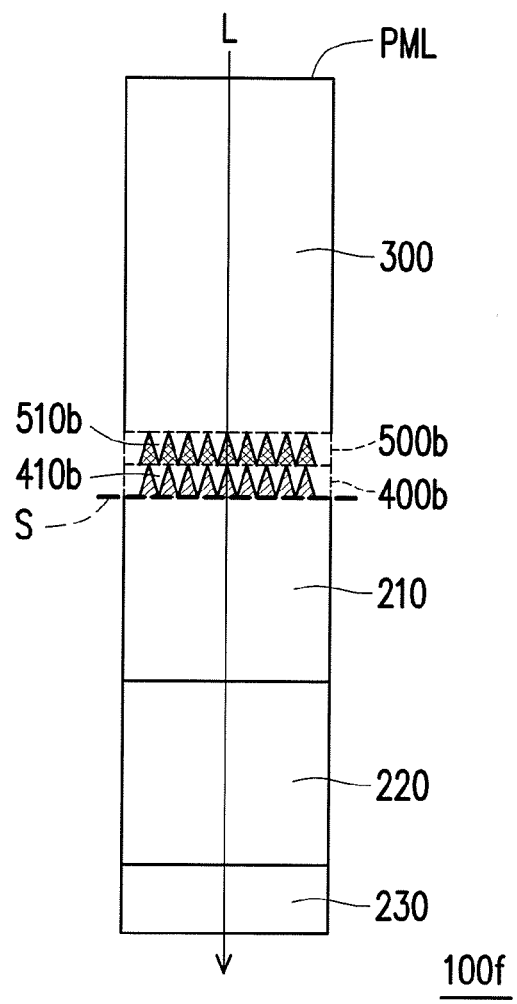
FIG. 6A is a cross-sectional view depicting a simulation of a photoelectric conversion device of another embodiment in the invention.
Figure 6B:
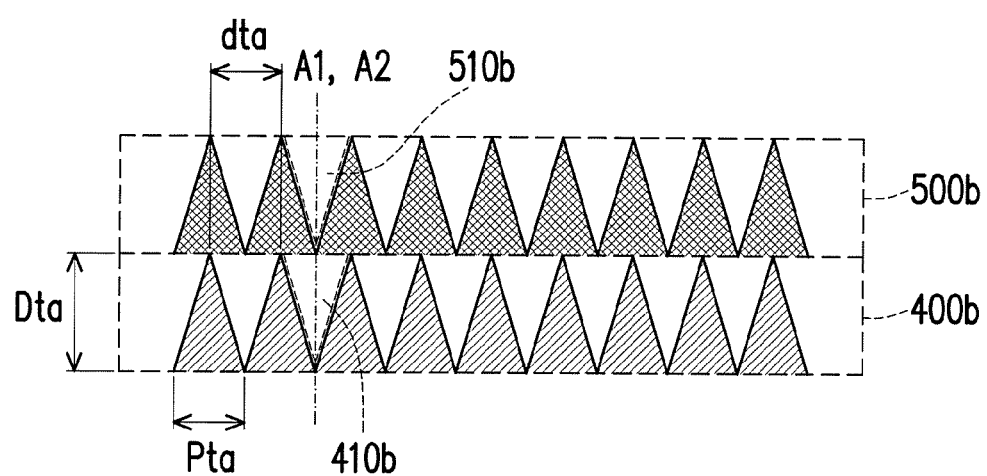
FIG. 6B is a cross-sectional view depicting the enlarged insulating material layer 400b and the photonic crystal layer 500b in FIG. 6A.

FIG. 6A is a cross-sectional view depicting a simulation of a photoelectric conversion device of another embodiment in the invention. FIG. 6B is a cross-sectional view depicting the enlarged insulating material layer 400b and the photonic crystal layer 500b in FIG. 6A. Referring to FIG. 6A and FIG. 6B, in the present embodiment, the photoelectric conversion device 100f is similar to the photoelectric conversion device 100c in FIG. 4D and the photonic crystal layer 500b of the photoelectric conversion device 100f includes a plurality of first cavities 510b extended in the direction perpendicular to a surface S of the photoelectric converter 200, the first cavities 510b are periodically arranged, and the first cavities 510b are, for example, cylindrical cavities, or conical cavities, or cavities having other shapes. The main elements of the photoelectric conversion device 100f can be referenced from the photoelectric conversion device 100c and will not be repeated. The difference is that, the insulating material layer 400b of the photonic conversion device 100f includes a plurality of second cavities 410b extended in the direction perpendicular to the surface S of the photoelectric converter 200, the second cavities 410b are periodically arranged, and the second cavities 410b are, for example, cylindrical cavities, or conical cavities, or cavities having other shapes.

Specifically, in the present embodiment, the first cavities 510b of the photoelectric conversion device 100f can be conical cavities and the ratio of the diameter dta to the depth Dta and the pitch Pta of two adjacent first cavities 510b can be referenced to the photoelectric conversion device 100c in FIG. 4D and FIG. 4E. The second cavities 410b of the photoelectric conversion device 100f can be the conical cavities, and the ratio of the diameter dta to the depth Dta of the conical cavities 410b is from 0.5 to 0.9. The pitch Pta of two adjacent second cavities 410b is from 1 to 1.2 μm. In the present embodiment, the material of the photonic crystal layer 500b having the first cavities 510b with periodic property is silicon dioxide, and the material of the insulating material layer 400b having the second cavities 410b with periodic property is titanium dioxide. Specifically, the central axis A1 of the first cavity 510b and the central axis A2 of the second cavity 410b are substantially coincident in a direction perpendicular to the surface S of the photoelectric converter 200, and the first cavity 510b and the second cavity 410b are aligned.

Figure 6C:
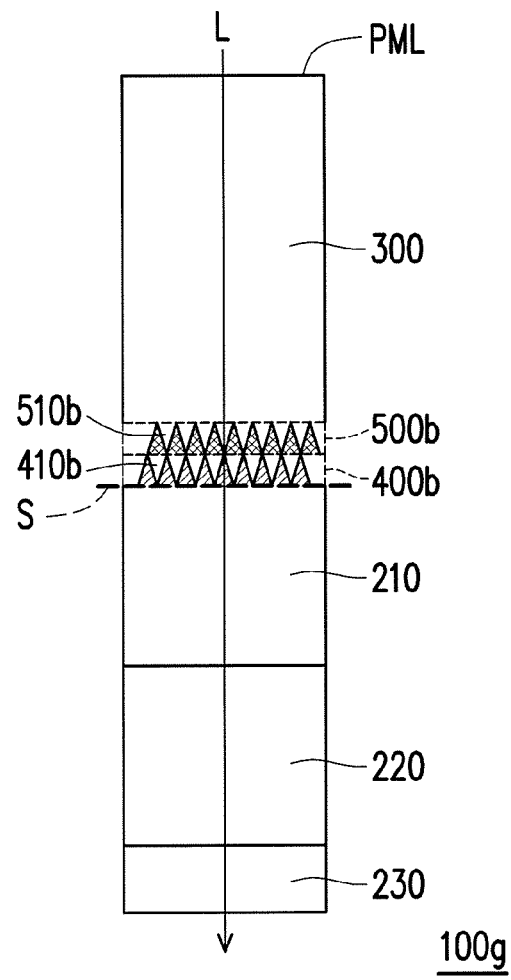
FIG. 6C is a cross-sectional view depicting a simulation of a photoelectric conversion device of another embodiment in the invention.
Figure 6D:
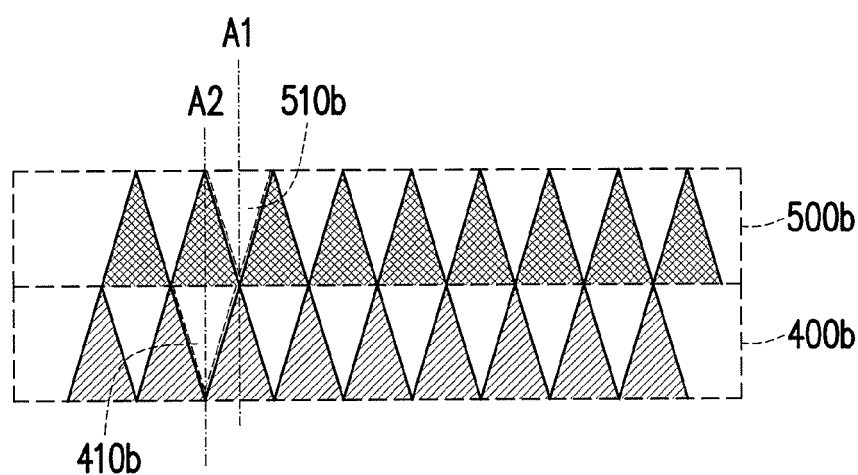
FIG. 6D is a cross-sectional view depicting the enlarged insulating material layer 400b and the photonic crystal layer 500b in FIG. 6C.

FIG. 6C is a cross-sectional view depicting a simulation of a photoelectric conversion device of another embodiment in the invention. FIG. 6D is a cross-sectional view depicting the enlarged insulating material layer 400b and the photonic crystal layer 500b in FIG. 6C. Referring to FIG. 6C and FIG. 6D, in the present embodiment, the photoelectric conversion device 100g is similar to the photoelectric conversion device 100f, and the main elements of the photoelectric conversion device 100g can be referenced from the photoelectric conversion device 100f and will not be repeated. The difference is that, the central axis A1 of the first cavity 510b and the central axis A2 of the second cavity 410b are not substantially coincident in a direction perpendicular to the surface S of the photoelectric converter 200, and the first cavity 510b and the second cavity 410b are not aligned.

Figure 6E:
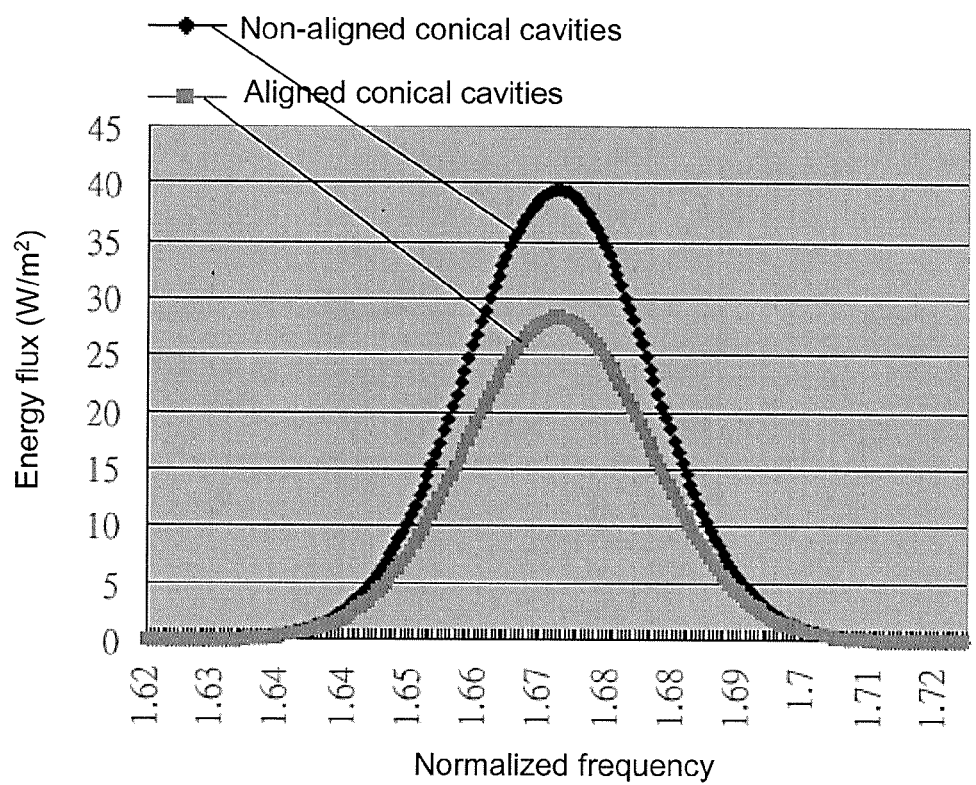
FIG. 6E is a graph depicting the simulation results of energy flux and normalized frequency of the photoelectric conversion device 100f in FIG. 6A and the photoelectric conversion device 100g in FIG. 6C.

FIG. 6E is a graph depicting the simulation results of energy flux and normalized frequency of the photoelectric conversion device 100f in FIG. 6A and the photoelectric conversion device 100g in FIG. 6C. Referring to FIG. 6E, in the present embodiment, the photoelectric conversion device 100f and the photoelectric conversion device 100g are placed in a simulation environment which is the same as the simulation environment of the photoelectric conversion device 50 in FIG. 1. The simulation of the photoelectric conversion device 100f and the photoelectric conversion device 100g also includes simulating the perfectly matched layer PML which is used to fulfil the absorbent boundary conditions, and a surface receiving light L is located at the photoelectric converter 200 at the −2 μm position along the vertical direction (the position inside the photoelectric converter 200) to serve as a light receiving area R. The detail settings for the computational cell to simulate the energy flux of the photoelectric conversion device 100f and the photoelectric conversion device 100g by the finite-difference-time-domain method are referenced to the FIG. 1 and Table 1, and will not be repeated.

In the present embodiment, based on the results calculated by the finite-difference-time domain method, the calculated energy flux at receiving area R of the photoelectric conversion device 100f, which has the aligned first cavities 510b and second cavities 410b, is equal to 39.43540252 Watts per square meter. The calculated energy flux at receiving area R of the photoelectric conversion device 100g, which has the non-aligned first cavities 510b and second cavities 410b, is equal to 28.21903230 Watts per square meter. The energy transmission rate relatively between the photoelectric conversion device 100f and the photoelectric conversion device 100g can be calculated by dividing the calculated energy flux at receiving area R of the photoelectric conversion device 100f by the calculated energy flux at receiving area R of the photoelectric conversion device 100g. Namely, 39.43540252 Watts per square meter is divided by 28.21903230 Watts per square meter and multiplied by 100%, so as to obtain that the energy transmission rate is equal to 139.75%. It is described in FIG. 6E that, the energy flux at the receiving area R of the photoelectric conversion device 100f is greater than the energy flux at the receiving area R of the photoelectric conversion device 100g. In the present embodiment, the photoelectric conversion device 100f having the aligned first cavities 510b and second cavities 410b has a larger quantity of incident light than the photoelectric conversion device 100g having the non-aligned first cavities 510b and second cavities 410b.

The Table 2 below shows the energy transmission efficiency of the photoelectric conversion device of the present embodiment relative to the air. It should be noted that the invention is not limited to the data listed in Table 2. It should be known to those ordinary skilled in the art that various modifications and variations can be made to the parameters or settings of the present invention without departing from the scope or spirit of the invention.

TABLE 2

| Media | Energy flux (Watts per square meter) | Energy transmission rate (%) |
|---|---|---|
| Silicon solar cells (relative permittivity 12) | 29.99502167 | 65.7% |
| Silicon solar cells (relative permittivity 12) + single layer silicon dioxide flat plate | 32.05521301 | 70.2% |
| Silicon solar cells (relative permittivity 12) + single layer silicon dioxide having cylindrical cavities | 40.68963037 | 89.1% |
| Silicon solar cells (relative permittivity 12) + single layer titanium dioxide flat plate + single layer silicon dioxide flat plate | 34.83107839 | 76.3% |
| Silicon solar cells (relative permittivity 12) + single layer titanium dioxide flat plate + single layer silicon dioxide having cylindrical cavities | 42.28312740 | 92.6% |

Referring to simulation method of the embodiment in FIG. 2 by the finite-difference-time domain method and data in Table 2. In Table 2, the relative permittivity of the transparent cover is set to 1 (equivalent to the air) when the photoelectric conversion device is simulated by the finite-difference-time-domain method. In the Table 2, the silicon solar cells (relative permittivity 12) present the photoelectric conversion device, such as the photoelectric conversion device 50 in the embodiment in FIG. 1. The silicon solar cells (relative permittivity 12)+single layer silicon dioxide flat plate present the photoelectric conversion device, such as the photoelectric conversion device 100 which does not include the insulating material layer 400 in the embodiment in FIG. 2. The silicon solar cells (relative permittivity 12)+single layer silicon dioxide having cylindrical cavities present the photoelectric conversion device, such as the photoelectric conversion device 100a in the embodiment in FIG. 4A. The silicon solar cells (relative permittivity 12)+single layer titanium dioxide flat plate+single layer silicon dioxide flat plate present the photoelectric conversion device, such as the photoelectric conversion device 100 in the embodiment in FIG. 2. The silicon solar cells (relative permittivity 12)+single layer titanium dioxide flat plate+single layer silicon dioxide having cylindrical cavities present the photoelectric conversion device, such as the photoelectric conversion device 100b in the embodiment in FIG. 4C. However, the invention is not limited to the above-mentioned composition of the components, and the corresponding set values in the simulation is also not limited to the above-mentioned set values. The materials, the layer configuration, the shape of the surface, etc., of the photoelectric conversion device in embodiments of the invention can all be adjusted according to design specification. In addition, it should be noted that the perfectly matched layer PML of the photoelectric conversion device 100, 100*a*, 100*b*, 100*c*, 100*d*, 100*e*, 100*f*, and 100*g* serves as an absorbent boundary in the simulation environment. However, in a real product, the photoelectric conversion device does not include the perfectly matched layer PML.

In summary, the insulating material layer is disposed between the photoelectric converter and the transparent cover, the photonic crystal layer is disposed between the insulating material layer and the transparent cover, and the material of the photonic crystal layer is different from the material of the insulating material layer in the embodiments of the invention, so as to increase the quantity of incident light of the photoelectric converter. In the embodiments of the invention, and the photonic crystal layer includes a plurality of first cavities extended in the direction perpendicular to a surface of the photoelectric converter, wherein the first cavities are periodically arranged, so as to increase the quantity of incident light of the photoelectric converter.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A photoelectric conversion device, comprising:
    a photoelectric converter, configured to receive light, wherein the photoelectric converter is a solar cell;
    a transparent cover, disposed on a side of the photoelectric converter;
    an insulating material layer, disposed between the photoelectric converter and the transparent cover; and
    a photonic crystal layer, disposed between the insulating material layer and the transparent cover passed through by the light, wherein a material of the photonic crystal layer is different from a material of the insulating material layer.

2. The photoelectric conversion device as recited in claim 1, wherein the insulating material layer is a flat plate, and the photonic crystal layer comprises a plurality of first cavities extended in a direction perpendicular to a surface of the photoelectric converter, wherein the first cavities are periodically arranged.

3. The photoelectric conversion device as recited in claim 2, wherein the first cavities are cylindrical cavities or conical cavities.

4. The photoelectric conversion device as recited in claim 1, wherein the photonic crystal layer comprises a plurality of the first cavities extended in a direction perpendicular to a surface of the photoelectric converter; and the insulating material layer comprises a plurality of second cavities extended in the direction perpendicular to the surface of the photoelectric converter, wherein the first cavities are periodically arranged, the second cavities are periodically arranged.

5. The photoelectric conversion device as recited in claim 4, wherein the first cavities are cylindrical cavities or conical cavities.

6. The photoelectric conversion device as recited in claim 4, wherein the second cavities are cylindrical cavities or conical cavities.

7. The photoelectric conversion device as recited in claim 4, wherein the first cavities are periodically arranged, the second cavities are periodically arranged, and a central axis of the first cavity and a central axis of the second cavity are substantially coincident in a direction perpendicular to the surface of the photoelectric converter.

8. The photoelectric conversion device as recited in claim 4, wherein the first cavities are periodically arranged, the second cavities are periodically arranged, and a central axis of the first cavity and a central axis of the second cavity are not substantially coincident in a direction perpendicular to the surface of the photoelectric converter.

9. The photoelectric conversion device as recited in claim 1, wherein a material of the insulating material layer comprises titanium dioxide, or silicon dioxide.

10. The photoelectric conversion device as recited in claim 1, wherein a material of the photonic crystal layer comprises silicon dioxide or titanium dioxide.

* * * * *